US012615709B2

(12) United States Patent
Woolrich et al.

(10) Patent No.: US 12,615,709 B2
(45) Date of Patent: Apr. 28, 2026

(54) MULTI-EMBEDDED CIRCUIT BOARD

(71) Applicant: THE BOEING COMPANY, Arlington, VA (US)

(72) Inventors: Kyle Avery Woolrich, El Segundo, CA (US); Paul Christian Werntz, Long Beach, CA (US)

(73) Assignee: THE BOEING COMPANY, Arlington, VA (US)

( * ) Notice: Subject to any disclaimer, the term of this patent is extended or adjusted under 35 U.S.C. 154(b) by 206 days.

(21) Appl. No.: 18/323,964

(22) Filed: May 25, 2023

(65) Prior Publication Data

US 2024/0397605 A1     Nov. 28, 2024

(51) Int. Cl.
| | |
|---|---|
| *H05K 1/02* | (2006.01) |
| *H01P 5/107* | (2006.01) |
| *H05K 1/11* | (2006.01) |

(52) U.S. Cl.
CPC .......... *H05K 1/0209* (2013.01); *H01P 5/107* (2013.01); *H05K 1/0243* (2013.01); *H05K 1/0272* (2013.01); *H05K 1/115* (2013.01); *H05K 2201/10098* (2013.01)

(58) Field of Classification Search
CPC .... H01P 5/107; H05K 1/0209; H05K 1/0243; H05K 1/0272; H05K 1/115; H05K 2201/10098; H05K 1/144
See application file for complete search history.

(56) References Cited

U.S. PATENT DOCUMENTS

| | | | |
|---|---|---|---|
| 4,215,313 A * | 7/1980 | Chang .................. | H03D 9/0641 |
| | | | 333/228 |
| 10,912,195 B2 | 2/2021 | Wu et al. | |
| 11,375,616 B2 | 6/2022 | Wu et al. | |
| 2020/0214131 A1 | 7/2020 | Wu et al. | |

FOREIGN PATENT DOCUMENTS

| | | | | |
|---|---|---|---|---|
| JP | 07211817 A | * | 8/1995 | |

* cited by examiner

*Primary Examiner* — Andrea Lindgren Baltzell
*Assistant Examiner* — Kimberly E Glenn
(74) *Attorney, Agent, or Firm* — Moore IP Law

(57)     ABSTRACT
A multi-embedded circuit board includes a first circuit board and a first cold plate thermally coupled to the first circuit board. The first circuit board includes a substrate and a power amplifier within the substrate, the power amplifier electrically coupled to one or more electromagnetic signal interfaces. The first cold plate includes one or more first cooling elements configured to extract heat from the power amplifier.

20 Claims, 6 Drawing Sheets

MULTI-EMBEDDED CIRCUIT BOARD

FIELD OF THE DISCLOSURE

The subject disclosure is generally related to a multi-embedded circuit board.

BACKGROUND

Generally, a multi-embedded circuit board can combine multiple different integrated circuit boards in a single integrated assembly. For example, a multi-embedded radio frequency board can combine embedded radio frequency module printed circuit board(s) with radio frequency signal generating printed circuit board(s) and communication printed circuit board(s). Such multi-embedded radio frequency boards can be configured to include a larger number of components and increased signal processing capabilities. However, the thermal resistance of certain layers of a multi-embedded circuit board can limit the operational parameters of the multi-embedded circuit board. For example, a particular multi-embedded radio frequency board may not be able to achieve a certain radio frequency power output due to the inability of the board to sufficiently dissipate heat from the board's amplifier component(s).

SUMMARY

In a particular implementation, a circuit board includes a substrate, a power amplifier within the substrate, and one or more waveguide launchers within the substrate and electrically coupled to the power amplifier.

In another particular implementation, a multi-embedded circuit board includes a first circuit board that includes a substrate and a power amplifier within the substrate, the power amplifier electrically coupled to one or more electromagnetic signal interfaces. The multi-embedded circuit board also includes a cold plate thermally coupled to the first circuit board, the cold plate includes one or more cooling elements configured to extract heat from the power amplifier.

In another particular implementation, a multi-embedded circuit board includes a plurality of circuit boards stacked one on another, at least one of the circuit boards of the plurality of circuit boards being configured so as to have a different processing function than another processing function of another circuit board of the plurality of circuit boards. The multi-embedded circuit board also includes an interconnection join layer disposed between adjacent circuit boards of the plurality of circuit boards, wherein the interconnection join layer is physically coupled to the adjacent circuit boards and includes vias that extend through the interconnection join layer to electrically couple the adjacent circuit boards to each other so as to form an integrated circuit board module having a predetermined electromagnetic communication characteristic. The multi-embedded circuit board also includes a cold plate coupled to an end of the integrated circuit board module, and a power amplification layer coupled to the cold plate, the power amplification layer communicatively coupled to the integrated circuit board module by one or more waveguides that extend through the cold plate.

DETAILED DESCRIPTION

Aspects disclosed herein illustrate a circuit board, particularly for use in a multi-embedded radio frequency ("RF") circuit board module. Aspects disclosed herein can improve the functionality and operational quality of a multi-embedded circuit board module by, for example, improving heat dissipation associated with one or more RF amplification components. In certain current multi-embedded circuit board modules, the output RF power is limited by the thermal resistance of one or more of the layers comprising the multi-embedded circuit board module. The systems and methods disclosed allow for significantly increased RF power by allowing for the positioning of amplification components directly above fluidic thermal channels with minimal thermal resistance.

In a particular aspect, one or more power amplifier(s) can be embedded in a circuit board substrate along with one or more waveguide launchers within the substrate and electrically coupled to the power amplifier(s). The embedded power amplifier(s) and waveguide launchers can be positioned between a heat dissipation layer including a plurality of fluidic thermal channels.

The figures and the following description illustrate specific exemplary embodiments. It will be appreciated that those skilled in the art will be able to devise various arrangements that, although not explicitly described or shown herein, embody the principles described herein and are included within the scope of the claims that follow this description. Furthermore, any examples described herein are intended to aid in understanding the principles of the disclosure and are to be construed as being without limitation. As a result, this disclosure is not limited to the specific embodiments or examples described below, but by the claims and their equivalents.

Figure 1:
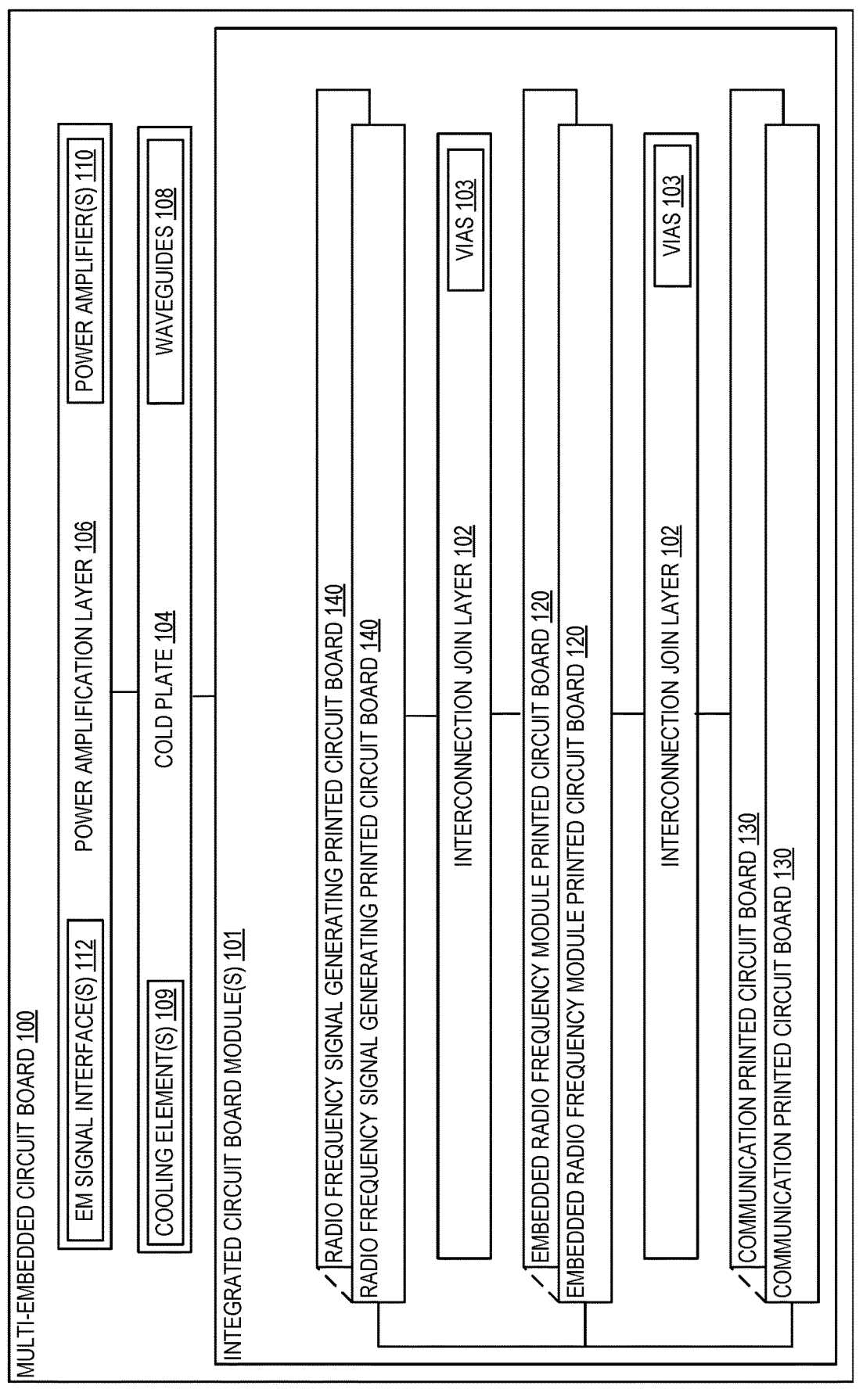
FIG. 1 depicts an example multi-embedded circuit board, in accordance with at least one implementation of the subject disclosure.

Particular implementations are described herein with reference to the drawings. In the description, common features are designated by common reference numbers throughout the drawings. As used herein, various terminology is used for the purpose of describing particular implementations only and is not intended to be limiting. For example, the singular forms "a," "an," and "the" are intended to include the plural forms as well, unless the context clearly indicates otherwise. Further, some features described herein are singular in some implementations and plural in other implementations. To illustrate, FIG. 1 depicts a multi-embedded circuit board 100 including one or more integrated circuit board modules ("integrated circuit board module" 101 in FIG. 1), which indicates that in some implementations the multi-embedded circuit board 100 includes a single integrated circuit board module 101 and in other implementations the multi-embedded circuit board 100 includes multiple integrated circuit board modules 101. For ease of reference herein, such features are generally introduced as "one or more" features and are subsequently referred to in the singular unless aspects related to multiple of the features are being described.

The terms "comprise," "comprises," and "comprising" are used interchangeably with "include," "includes," or "including." Additionally, the term "wherein" is used interchangeably with the term "where." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements.

As used herein, "generating," "calculating," "using," "selecting," "accessing," and "determining" are interchangeable unless context indicates otherwise. For example, "generating," "calculating," or "determining" a parameter (or a signal) can refer to actively generating, calculating, or determining the parameter (or the signal) or can refer to using, selecting, or accessing the parameter (or signal) that is already generated, such as by another component or device. As used herein, "coupled" can include "communicatively coupled," "electrically coupled," or "physically coupled," and can also (or alternatively) include any combinations thereof. Two devices (or components) can be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled can be included in the same device or in different devices and can be connected via electronics, one or more connectors, or inductive coupling, as illustrative, non-limiting examples. In some implementations, two devices (or components) that are communicatively coupled, such as in electrical communication, can send and receive electrical signals (digital signals or analog signals) directly or indirectly, such as via one or more wires, buses, networks, etc. As used herein, "directly coupled" is used to describe two devices that are coupled (e.g., communicatively coupled, electrically coupled, or physically coupled) without intervening components.

FIG. 1 depicts an example multi-embedded circuit board 100, in accordance with at least one implementation of the subject disclosure. In some implementations, the multi-embedded circuit board 100 includes integrated circuit board module(s) 101 coupled to a cold plate 104 at an end of the integrated circuit board module 101. The multi-embedded circuit board 100 can also include a power amplification layer 106 coupled to the cold plate, the power amplification layer 106 communicatively coupled to the integrated circuit board module(s) 101 by one or more waveguides 108 that extend through the cold plate 104.

In some implementations, the integrated circuit board module(s) 101 can include a plurality of circuit boards stacked one on another, where at least one of the circuit boards of the plurality of circuit boards is configured so as to have a different processing function than another processing function of another circuit board of the plurality of circuit boards. For example, the integrated circuit board module(s) 101 can include one or more radio frequency signal generating printed circuit boards 140, one or more embedded radio frequency module printed circuit boards 120, and one or more communication printed circuit boards 130.

The multi-embedded circuit board 100 can provide an increased surface area for mounting surface mount components or printed components (such as antennas) where the increase in surface area is affected through embedding components within the multi-embedded circuit board 100. For example, the integrated circuit board module 101 having multiple circuit boards stacked one board on top of the other boards so that components that would otherwise occupy the surface area of the multi-embedded circuit board 100 can be embedded within the circuit boards of the stack of printed circuit boards. The increased surface area can provide, for example, a larger array of antenna elements to be coupled to the multi-embedded circuit board 100. Aspects of the subject disclosure also provide increased capabilities (e.g., signal generation, signal processing, signal transmission, signal reception, signal routing, power routing, etc. as described herein) within the integrated circuit board module 101 of the multi-embedded circuit board 100.

The stacked interconnection and coupling of the adjacent circuit boards of the integrated circuit board module 101 mitigate radio frequency signal loss that would otherwise occur because of transmission of the radio frequency signal through cables and would otherwise directly translate into a radio frequency power loss for a transmitter or a degradation to noise for a receiver. For example, an embedded radio frequency processing component may be placed substantially directly at feeds of an antenna component.

In some aspects, the integrated circuit board module(s) 101 can also include an interconnection join layer disposed between adjacent circuit boards of the plurality of circuit boards, wherein the interconnection join layer is physically coupled to the adjacent circuit boards and includes vias that extend through the interconnection join layer to electrically couple the adjacent circuit boards to each other so as to form an integrated circuit board module having a predetermined electromagnetic communication characteristic. For example, the integrated circuit board module(s) 101 can include an interconnection join layer 102 between the radio frequency signal generating printed circuit board(s) 140 and the embedded radio frequency module printed circuit board(s) 120 and an interconnection join layer 102 between the embedded radio frequency module printed circuit board(s) 120 and the communication printed circuit board(s) 130. Each interconnection join layer 102 can include a plurality of vias 103 that extend through the respective interconnection join layer 102 to electrically couple the circuit boards on either side of the respective interconnection join layer 102. Each interconnection join layer 102 is physically coupled to the circuit boards on either side of the respective interconnection join layer 102.

The at least one radio frequency signal generating printed circuit board 140, the at least one embedded radio frequency module printed circuit board 120, and the at least one communication printed circuit board 130 can be stacked one board on top of another to form a stack of printed circuit boards. Adjacent boards of the at least one radio frequency signal generating printed circuit board 140, the at least one embedded radio frequency module printed circuit board 120, and the at least one communication printed circuit board 130 are coupled by a respective interconnection join layer 102 to form the integrated printed circuit board module 101. The interconnection join layer 102 is disposed between adjacent printed circuit boards to physically and electrically couple the adjacent printed circuit boards to each other to form the integrated printed circuit board module 101 having a predetermined radio frequency communication characteristic. The predetermined radio frequency communication characteristic may be one or more of radio frequency signal reception and transmission, radio frequency lensing, and radio frequency repetition.

In some implementations, the multi-embedded circuit board 100 also includes the cold plate 104. In some aspects, the cold plate 104 can include a plurality of cooling elements (e.g., fluid-filled channels), as described in more detail below with reference to FIGS. 5-7. In a particular aspect, the cold plate 104 can also be configured to be directly physically coupled to the power amplification layer 106, as described in more detail below with reference to FIG. 5. In the same or alternative aspects, the cold plate 104 can include a plurality of layers, as described in more detail below with reference to FIGS. 6-7. In any configuration, the cold plate 104 is thermally coupled to the power amplification layer 106 and includes one or more cooling elements 109 configured to extract heat from the amplification components of the power amplification layer 106 (e.g., the power amplifier(s) 110 of the power amplification layer 106, as described in more detail below with reference to FIGS. 5-7). The cold plate 104 also includes a plurality of waveguides 108 that extend through the cold plate 104, communicatively coupling the power amplification layer 106 to the integrated circuit board module(s) 101.

In some implementations, the power amplification layer 106 includes one or more power amplifiers 110 electrically coupled to one or more electromagnetic ("EM") signal interfaces 112. The power amplifier(s) 110 can be, for example, solid state power amplifiers. In some aspects, the power amplification layer 106 includes a substrate and the power amplifier(s) 110 within the substrate. The power amplification layer 106 can also include one or more waveguide launchers within the substrate and electrically coupled to the power amplifier(s) 110.

In some aspects, the EM signal interface(s) 112 can be configured to communicatively couple the power amplification layer 106 to an external EM signal source. For example, the EM signal interface(s) 112 can include a coaxial interface. As an additional example, the EM signal interface(s) 112 can include a waveguide. In such a configuration, the power amplification layer 106 can also include one or more waveguide launchers within a substrate of the power amplification layer 106 and electrically coupled to the power amplifier(s) 110, wherein at least one of the waveguide launcher(s) is coupled to the waveguide. As described in more detail below with reference to FIGS. 5-7, in some configurations the waveguide can be configured to substantially align with a corresponding waveguide of the integrated circuit board module(s) 101.

In a particular aspect, the EM signal interface(s) 112 can include one or more input EM signal interfaces and one or more output EM signal interfaces. For example, the EM signal interface(s) 112 can include a waveguide configured to receive an EM signal from the integrated circuit board module(s) 101 and a waveguide configured to transmit an EM signal (e.g., post-amplification) from the power amplification layer 106.

The multi-embedded circuit board 100 can be configured to have one or more processing functions. For example, the processing function can include adjusting an electromagnetic signal. For example, the multi-embedded circuit board 100 can be configured to amplify the electromagnetic signal. Adjusting the electromagnetic signal can also include receiving the electromagnetic signal at a first end of the multi-embedded circuit board 100 and transmitting the electromagnetic signal at a second end of the multi-embedded circuit board 100.

In some aspects, the power amplification layer 106 can also include one or more antenna elements. For example, the power amplification layer 106 can include an antenna element within the substrate of the power amplification layer 106, wherein the antenna element is coupled to the power amplifier(s) 110. In a particular configuration, the antenna element can include an element of a phased array antenna. In another particular configuration, the multi-embedded circuit board 100 can include an array. In such a configuration, the power amplification layer 106 can also include a substrate and a plurality of power amplifiers (e.g., the power amplifier(s) 110) within the substrate, each of the power amplifiers electrically coupled to one or more EM signal interfaces (e.g., the EM signal interface(s) 112) and each of the plurality of power amplifiers associated with a respective one of the plurality of elements of the phased array.

One technical benefit of the multi-embedded circuit boards of the subject disclosure is reduction in human error in the assembly of the multi-embedded circuit board 100 and provision for low-cost, highly repeatable, and high-performance phased array antenna systems, radio frequency repeater systems, and/or radio frequency lens systems. For example, any embedded components are disposed within a respective circuit board as that circuit board is formed and inspected in an automated machine process. Any surface mount components of the multi-embedded circuit board 100 are also coupled to the multi-embedded circuit board 100 and inspected in an automated machine process. Humans merely move subassemblies of the multi-embedded circuit board 100 from one automated machine process to another automated machine process.

One technical benefit of directly coupling the power amplification layer 106 to the cold plate 104 is an increase in the amount of heat dissipated from the power amplification layer 106, allowing the power amplification layer 106 to amplify an electromagnetic signal to a higher power output level. This can allow the multi-embedded circuit board 100 to operate at higher electromagnetic power output levels for various operations.

The multi-embedded circuit board 100, in accordance with the aspects of the subject disclosure, may be employed in receive and/or transmit phased array communications terminals. For example, the multi-embedded circuit board 100 of the subject disclosure may be used to facilitate, as non-limiting examples, air-to-space communications, air-to-ground communications, air-to-air communications, ground-to-space communications, ground-to-ground communications, mobile-to-mobile space-to-ground communications, and space-to-space communications. The multi-embedded circuit board 100, in accordance with aspects of the subject disclosure, may also be employed to receive and/or transmit actively scanned radars in, as non-limiting examples, airborne, land-based, sea, and space applications. The multi-embedded circuit board 100 may also be employed as a radio frequency signal repeater, as described in more detail below with reference to FIG. 3, or a radio frequency signal lens, as described in more detail below with reference to FIG. 4. The multi-embedded circuit board 100 may also provide for a steerable antenna for mobile applications such as in a mobile device, as described in more detail below with reference to FIG. 2. Aspects of the subject disclosure may operate in any suitable frequency range(s) including, but not limited to, microwave frequency, millimeter frequencies, and 5G applications (and above).

In operation, coupling the power amplification layer 106 directly to the cold plate 104, coupling the cold plate 104 to an end of the integrated circuit board module 101, and communicatively coupling the power amplification layer 106 to the integrated circuit board module 101 by one or more waveguides 108 that extend through the cold plate 104 can provide increased EM signal power output from the integrated circuit board module 101 by reducing the thermal resistance between amplification components (e.g., the power amplifier(s) 110) and heat dissipation components (e.g., the cold plate 104).

Figure 2:
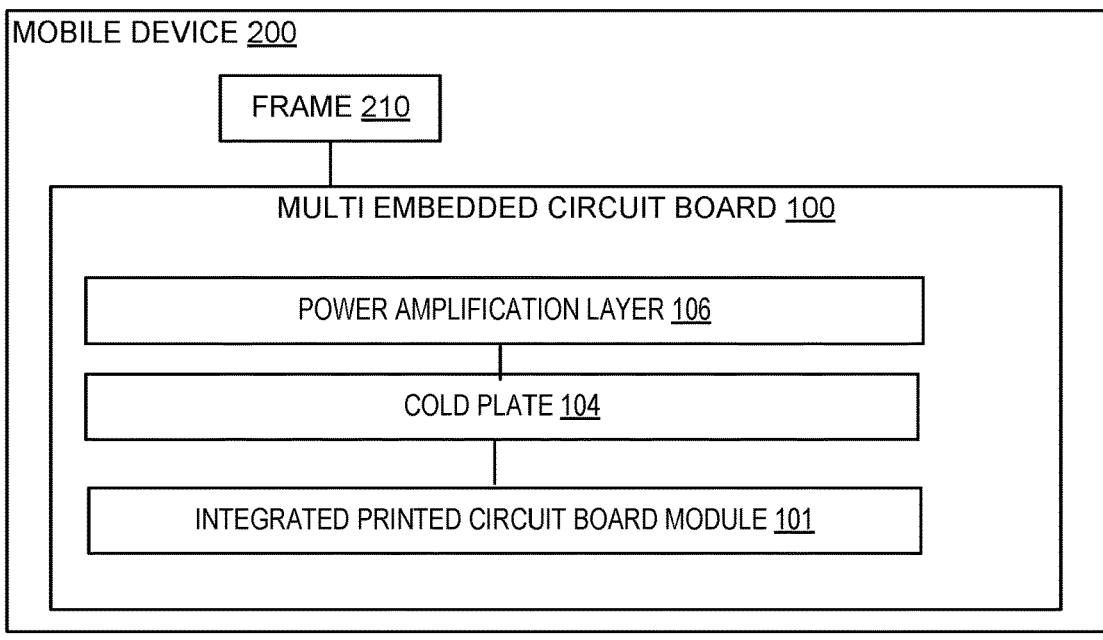
FIG. 2 illustrates a block diagram of an exemplary mobile device including the multi-embedded circuit board of FIG. 1, in accordance with certain aspects of the subject disclosure.

FIG. 2 illustrates a block diagram of an exemplary mobile device 200 including the multi-embedded circuit board 100 of FIG. 1, in accordance with certain aspects of the subject disclosure. In some implementations, the mobile device 200 can be a handheld communication device (e.g., cellular phone, handheld radio, etc.), a spacecraft (e.g., satellite, space shuttle, space capsule, telescope, etc.), an aircraft (lighter than air vehicle, fixed wing aircraft, variable wing aircraft, tilt-rotor aircraft, rotary wing aircraft, etc.), a maritime vessel, a terrestrial vehicle, another appropriate mobile device, or some combination thereof. The mobile device 200 includes any suitable frame 210 to which the multi-embedded circuit board 100 of FIG. 1 is coupled. In some implementations, the multi-embedded circuit board 100 includes the power amplification layer 106 of FIG. 1 coupled to the cold plate 104, which can be coupled to an end of the integrated printed circuit board module 101, as described in more detail above with reference to FIG. 1. The power amplification layer 106 can be communicatively coupled to the integrated circuit board module 101 by one or more waveguides (e.g., the waveguides 108 of FIG. 1) that extend through the cold plate 104. One technical benefit of this arrangement is an increase in the amount of heat dissipated from the amplifiers included in the mobile device 200.

For example, a mobile/cellular phone including the multi-embedded circuit board 100 can include a radio frequency signal generating printed circuit board 140, an embedded radio frequency module printed circuit board 120, and a communication printed circuit board 130. The radio frequency signal generating printed circuit board 140 can include suitable components to configure the radio frequency signal generating printed circuit board 140 as a mobile communication device processor printed circuit board programmed to make, receive, and process cellular signals. The embedded radio frequency module printed circuit board 120 and the communication printed circuit board 130 may be configured as a radio frequency signal transceiver printed circuit board so as to send and receive cellular (or any other suitable radio frequency wavelength) signals.

In other aspects, the mobile device 200 can include a radio frequency signal input printed circuit board and/or a radio frequency output printed circuit board. In a particular aspect, the multi-embedded circuit board 100 is coupled to the frame 210 so that an array of antenna components is exposed (or if the frame 210 is radio frequency wave transparent, the antenna components may not be exposed) so as to transmit and receive cellular signals. In such a configuration, the array of antenna components can be steerable to point the array of the antenna component(s) to a particular target, by rotating (or otherwise changing an orientation) the handheld communication device.

In the same or alternative aspects, an antenna array of the multi-embedded circuit board 100 may be pointed by changing an attitude/orientation of the mobile device 200. The multi-embedded circuit board 100 can also be coupled to the spacecraft, the aircraft, the maritime vessel, etc. with a gimballed coupling so that the multi-embedded circuit board 100 may be pointed in a predetermined direction independent of the attitude/orientation of the mobile device 200.

Figure 3:
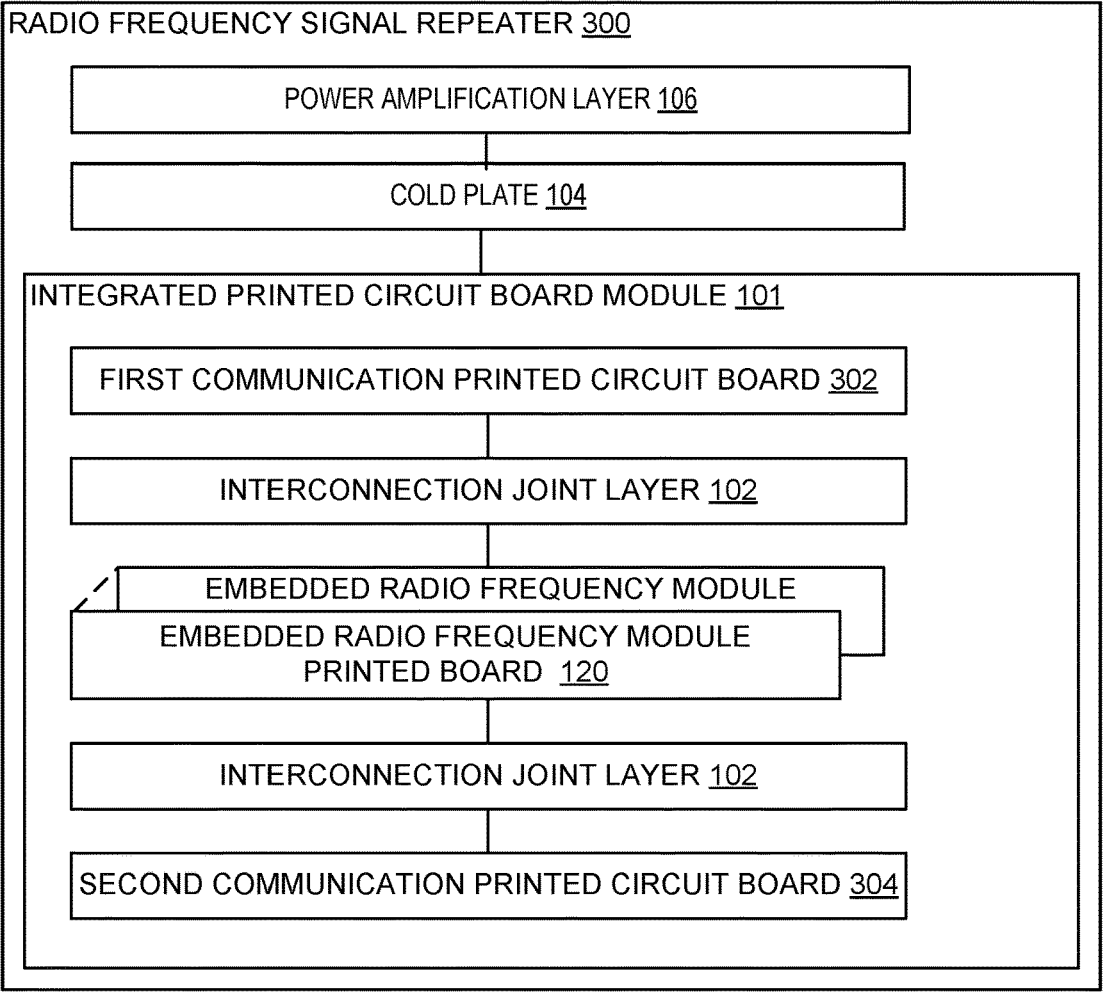
FIG. 3 illustrates a block diagram of an exemplary radio frequency signal repeater including the integrated circuit board of FIG. 1, in accordance with certain aspects of the subject disclosure.

FIG. 3 illustrates a block diagram of an exemplary radio frequency signal repeater 300 including the integrated circuit board module 101 of FIG. 1, in accordance with certain aspects of the subject disclosure. In some implementations, the radio frequency signal repeater 300 can include the power amplification layer 106 of FIG. 1 coupled to the cold plate 104, which can be coupled to an end of the integrated printed circuit board module 101, as described in more detail above with reference to FIG. 1. The power amplification layer 106 can be communicatively coupled to the integrated circuit board module 101 by one or more waveguides (e.g., the waveguides 108 of FIG. 1) that extend through the cold plate 104. One technical benefit of this arrangement is an increase in the amount of heat dissipated from the amplifiers included in the radio frequency signal repeater 300.

In some implementations, the integrated printed circuit board module 101 can include a first communication board 302 and a second communication printed circuit board 304. The first communication printed circuit board 302 and the second communication printed circuit board 304 may be substantially similar to the communication printed circuit board 130, as described in more detail above with reference to FIG. 1. The at least one embedded radio frequency module printed circuit board 120, the first communication printed circuit board 302, and the second communication printed circuit board 304 are stacked one board on top of another. Adjacent boards of the at least one embedded radio frequency module printed circuit board 120, the first communication printed circuit board 302, and the second communication printed circuit board 304 are coupled by a respective interconnection join layer 102 so as to form the integrated printed circuit board module 101.

In a particular aspect, the at least one embedded radio frequency module printed circuit board 120, the first communication printed circuit board 302, and the second communication printed circuit board 304 form a stack of printed circuit boards. One of the first communication printed circuit board 302 and the second communication printed circuit board 304 comprises a radio frequency signal output printed circuit board and the other board of the first communication printed circuit board 302 and the second communication printed circuit board 304 comprises a radio frequency signal input printed circuit board. The radio frequency signal input printed circuit board and the radio frequency signal output printed circuit board provide for the input and output of a common radio frequency signal so as to repeat the incoming radio frequency signal.

In some implementations, the integrated printed circuit board module 101 can include one or more embedded radio frequency module printed circuit boards 120, as described in more detail above with reference to FIG. 1. The embedded radio frequency module printed circuit board(s) 120 can include any suitable radio frequency signal conditioner and/or radio frequency signal amplifier for amplifying and/or conditioning the repeated radio frequency signal.

In some implementations, the radio frequency signal repeater 300 can be bidirectional where the first communication printed circuit board 302 and the second communication printed circuit board 304 each include a radio frequency signal transceiver printed circuit board.

In some aspects, the radio frequency signal output printed circuit board and/or the radio frequency signal transceiver printed circuit board can include a radio frequency connector coupled thereto for outputting the repeated radio frequency signal. The radio frequency signal input printed circuit board and/or the radio frequency signal transceiver printed circuit board can also include a radio frequency connector coupled thereto for inputting the repeated radio frequency signal to the radio frequency signal repeater 300.

Figure 4:
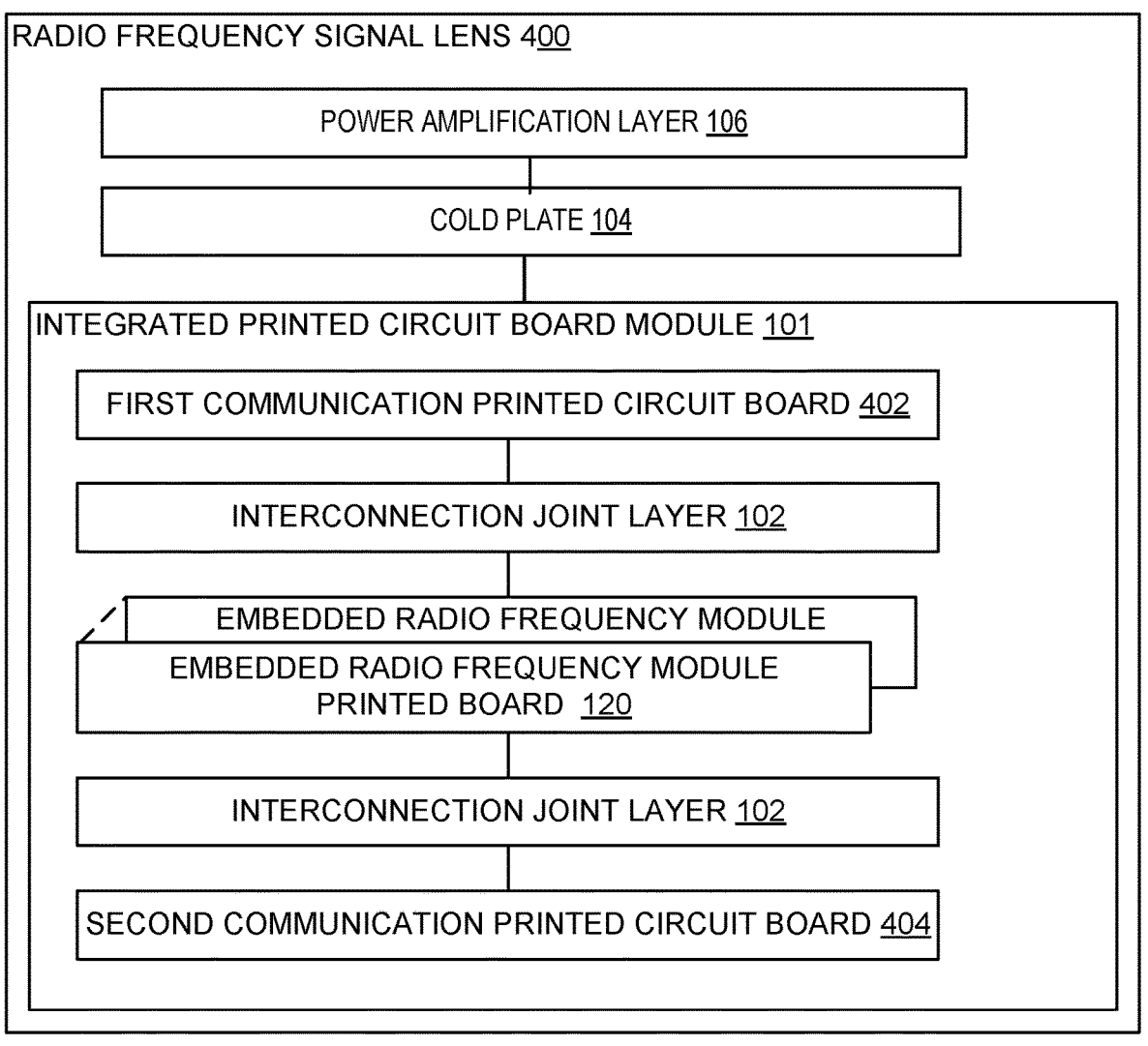
FIG. 4 illustrates a block diagram of an exemplary radio frequency signal lens including the integrated circuit board module of FIG. 1, in accordance with certain aspects of the subject disclosure.

FIG. 4 illustrates a block diagram of an exemplary radio frequency signal lens 400 including the integrated circuit board module 101 of FIG. 1, in accordance with certain aspects of the subject disclosure. In some implementations, the radio frequency signal lens 400 can include the power amplification layer 106 of FIG. 1 coupled to the cold plate 104, which can be coupled to an end of the integrated printed circuit board module 101, as described in more detail above with reference to FIG. 1. The power amplification layer 106 can be communicatively coupled to the integrated circuit board module 101 by one or more waveguides (e.g., the waveguides 108 of FIG. 1) that extend through the cold plate 104. One technical benefit of this arrangement is an increase in the amount of heat dissipated from the amplifiers included in the radio frequency signal lens 400.

In some implementations, the integrated printed circuit board module 101 can include a first communication printed circuit board 402 and a second communication printed circuit board 404. The first communication printed circuit board 402 and the second communication printed circuit board 404 may be substantially similar to the communication printed circuit board 130, as described in more detail above with reference to FIG. 1. The at least one embedded radio frequency module printed circuit board 120, the first communication printed circuit board 402, and the second communication printed circuit board 404 are stacked one board on top of another. Adjacent boards of the at least one embedded radio frequency module printed circuit board 120, the first communication printed circuit board 402, and the second communication printed circuit board 404 are coupled by a respective interconnection join layer 102 so as to form the integrated printed circuit board module 101.

In a particular aspect, the at least one embedded radio frequency module printed circuit board 120, the first communication printed circuit board 402, and the second communication printed circuit board 404 form a stack of printed circuit boards. One of the first communication printed circuit board 402 and the second communication printed circuit board 404 comprises a radio frequency signal output printed circuit board and the other board of the first communication printed circuit board 402 and the second communication printed circuit board 404 comprises a radio frequency signal input printed circuit board.

In some implementations, the integrated printed circuit board module 101 can include one or more embedded radio frequency module printed circuit boards 120, as described in more detail above with reference to FIG. 1. The embedded radio frequency module printed circuit board(s) 120 can include any suitable radio frequency signal conditioner and/or radio frequency signal amplifier for amplifying and/or conditioning the repeated radio frequency signal.

In some implementations, the radio frequency signal lens 400 can be bidirectional where the first communication printed circuit board 402 and the second communication printed circuit board 404 each include a radio frequency signal transceiver printed circuit board.

In some aspects, the radio frequency signal output printed circuit board and/or the radio frequency signal transceiver printed circuit board can include a radio frequency connector coupled thereto for outputting the focused radio frequency signal. The radio frequency signal input printed circuit board and/or the radio frequency signal transceiver printed circuit board can also include a radio frequency connector coupled thereto for inputting an input signal to the radio frequency signal lens 400.

Figure 5:
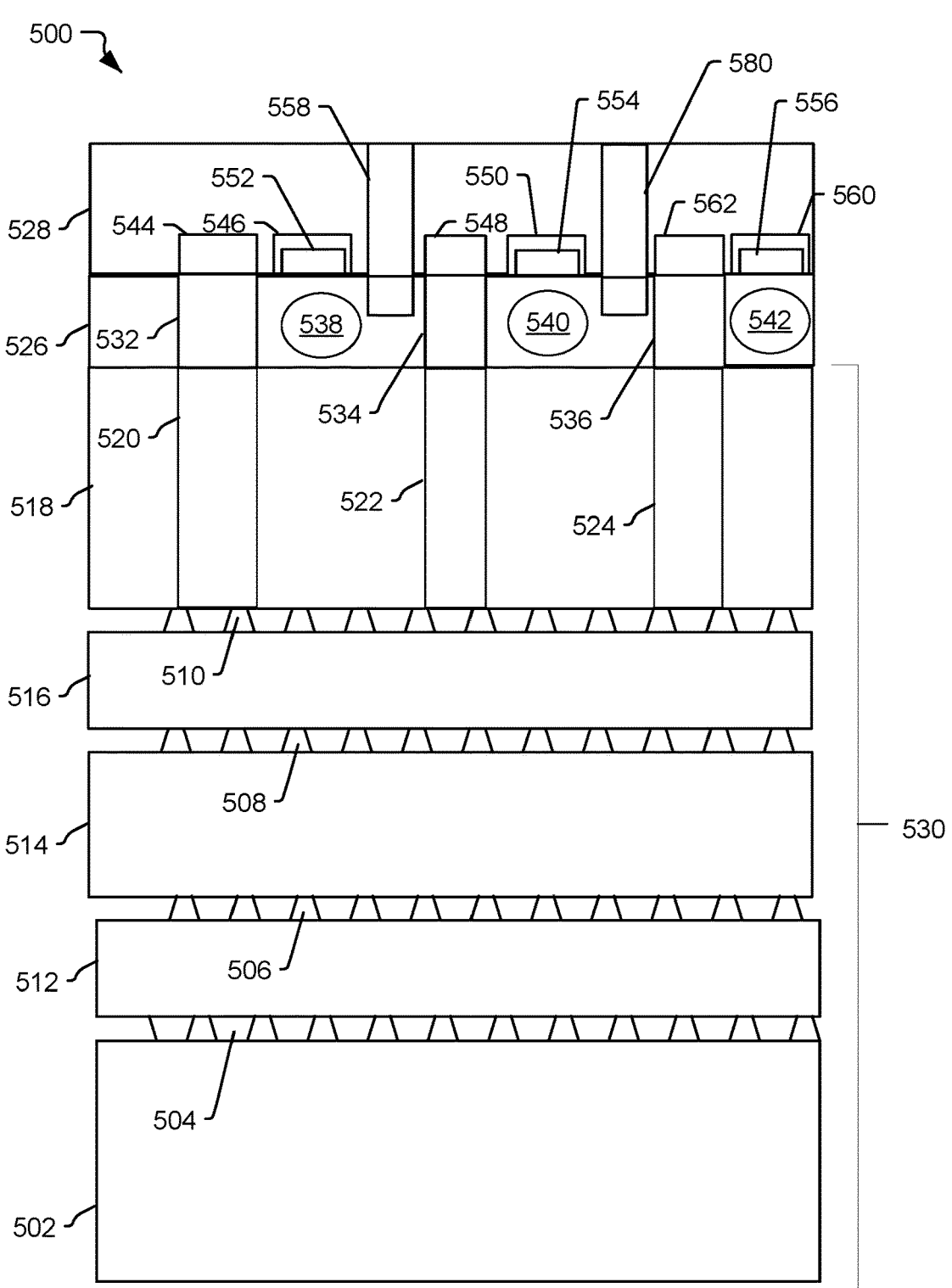
FIG. 5 illustrates a block diagram of an exemplary multi-embedded circuit board, in accordance with certain aspects of the subject disclosure.

FIG. 5 illustrates a block diagram of an exemplary multi-embedded circuit board 500, in accordance with certain aspects of the subject disclosure. Generally, the multi-embedded circuit board 500 corresponds to the multi-embedded circuit board 100 of FIG. 1. The multi-embedded circuit board 500 includes a digital printed circuit board layer 502, an electromagnetic signal conditioning layer 512, an electromagnetic signal routing layer 514, an electromagnetic signal driver layer 516, a waveguide launcher layer 518, a cold plate 526, and a power amplification layer 528. Generally, the cold plate 526 corresponds to the cold plate 104 of FIG. 1 and the power amplification layer 528 corresponds to the power amplification layer 106 of FIG. 1. In some aspects, the combination of the digital printed circuit board layer 502, the electromagnetic signal conditioning layer 512, the electromagnetic signal routing layer 514, the electromagnetic signal driver layer 516, and the waveguide launcher layer 518 generally corresponds to the integrated circuit board module 101 of FIG. 1.

In some implementations, the multi-embedded circuit board 500 can include the digital printed circuit board layer 502. In some aspects, one or more printed boards of the digital printed circuit board layer 502 can be substantially similar to the communication printed circuit board(s) 130 of FIG. 1. The digital printed circuit board layer 502 can include one or more printed circuit boards configured to provide a communicative interface to a signal input and/or signal output, signal processing, other appropriate digital or other direct current-based components of the multi-embedded circuit board 500, or some combination thereof.

In some aspects, the digital printed circuit board layer 502 can be coupled to the electromagnetic signal conditioning layer 512 via an interconnection join layer (e.g., the interconnection join layer 102 of FIG. 1) that can include a plurality of vias 504. The vias 504 can be substantially similar to the vias 103 of FIG. 1. In some implementations, the electromagnetic signal conditioning layer 512 can include one or more printed circuit boards configured to provide conditioning to an electromagnetic signal input at the digital printed circuit board layer 502, including by having thereon one or more electromagnetic signal conditioning components. In some aspects, one or more printed circuit boards of the electromagnetic signal conditioning layer 512 can be substantially similar to the embedded radio frequency module printed circuit board 120 of FIG. 1.

In some aspects, the electromagnetic signal conditioning layer 512 can be coupled to the electromagnetic signal routing layer 514 via an interconnection join layer (e.g., the interconnection join layer 102 of FIG. 1) that can include a plurality of vias 506. The vias 506 can be substantially similar to the vias 103 of FIG. 1. The electromagnetic signal routing layer 514 can include one or more printed circuit boards configured to route one or more electromagnetic signals from the digital printed circuit board layer 502. In a particular aspect, one or more printed circuit boards of the electromagnetic signal routing layer 514 can be substantially similar to the embedded radio frequency module printed circuit board 120 of FIG. 1.

In some aspects, the electromagnetic signal routing layer 514 can be coupled to the electromagnetic signal driver layer 516 via an interconnection join layer (e.g., the interconnection join layer 102 of FIG. 1) that can include a plurality of vias 508. The vias 508 can be substantially similar to the vias 103 of FIG. 1. The electromagnetic signal driver layer 516 can include one or more printed circuit boards configured to amplify the electromagnetic signal routed to the electromagnetic signal driver layer 516 by the electromagnetic signal routing layer 514. In a particular aspect, the electromagnetic signal routing layer 514 can include one or more driver amplifiers configured to amplify the electromagnetic signal. In some configurations, one or more printed circuit boards of the electromagnetic signal driver layer 516 can be substantially similar to the embedded radio frequency module printed circuit board 120 of FIG. 1.

In some aspects, the electromagnetic signal driver layer 516 can be coupled to the waveguide launcher layer 518 via an interconnection join layer (e.g., the interconnection join layer 102 of FIG. 1) that can include a plurality of vias 510. The vias 510 can be substantially similar to the vias 103 of FIG. 1. The waveguide launcher layer 518 can include one or more printed circuit boards configured to launch some or all of the electromagnetic signal into one or more waveguides 520, 522, 524. In a particular aspect, one or more printed circuit boards of the waveguide launcher layer 518 can be substantially similar to the radio frequency signal generating printed circuit board 140 of FIG. 1. The waveguides 520, 522, 524 are configured to guide the amplified electromagnetic signal toward an output point for transmission. In a particular configuration, the waveguide launcher layer 518 can also include a plurality of thermal vias thermally coupling the electromagnetic signal driver layer 516 to the cold plate 526.

In some implementations, the multi-embedded circuit board 500 can include a cold plate 526 coupled to an end of the integrated circuit board module 530. In particular, the cold plate 526 is coupled to the end of the integrated circuit board module 530 at which the waveguide launcher layer 518 is present. In some aspects, the cold plate 526 can include a plurality of waveguides 532, 534, 536. Each of the waveguides 532, 534, 536 is positioned in such a manner as to align with each of the waveguides 520, 522, 524 of the waveguide launcher layer 518, respectively. The cold plate 526 can also include one or more cooling elements 538, 540, 542. In a particular aspect, the cooling elements 538, 540, 542 can include a fluid-filled channel configured to receive a cooling fluid and pass that fluid through the channel to remove heat from components proximate the cooling elements 538, 540, 542.

In some implementations, the multi-embedded circuit board 500 can also include the power amplification layer 528 coupled to the cold plate 526. The power amplification layer 528 can include a plurality of waveguides 544, 548, 562 positioned in such a manner as to align with each of the waveguides 532, 534, 536 of the cold plate 526. This positioning allows the amplified electromagnetic signal to be transmitted from the waveguide launcher layer 518 to the power amplification layer 528. The power amplification layer 528 can also include a plurality of power amplifiers 552, 554, 556, each of the power amplifiers 552, 554, 556 positioned within a cavity 546, 550, 560, respectively. Each of the power amplifiers 552, 554, 556 can be configured to substantially increase the output power of all or a portion of the electromagnetic signal input to the power amplification layer 528. Further, the cavities 546, 550, 560 can be positioned such that each cavity 546, 550, 560 is substantially over a respective one of the cooling elements 538, 540, 542. By configuring the power amplification layer 528 such that the power amplifiers 552, 554, 556 are placed in close proximity to the cooling elements of the cold plate 526, the multi-embedded circuit board 500 can improve heat removal from the power amplification layer 528. A technical benefit of improved heat removal from the power amplification layer 528 is that the amplification components of the power amplification layer 528 (e.g., the power amplifiers 552, 554, 556) can increase the output power of the electromagnetic signal without damaging any component of the multi-embedded circuit board 500.

In some aspects, the power amplification layer 528 can also include a plurality of waveguides 558, 580. Each of the plurality of waveguides 558, 580 can be configured to reach to an external surface of the power amplification layer, allowing the power amplification layer to output the amplified electromagnetic signal. For example, one or more antenna elements can be coupled to a major surface of the power amplification layer 528 such that the amplified electromagnetic signal can be output from the power amplification layer 528 to the one or more antenna elements.

FIG. 5 illustrates an exemplary multi-embedded circuit board 500 in which the cold plate 526 is directly coupled between the integrated circuit board module 530 and the power amplification layer 528, where the power amplification layer includes a plurality of power amplifiers 552, 554, 556. In other configurations, the power amplification layer 528 can be positioned within the cold plate 526 (or between two cold plates 526), as described in more detail below with reference to FIGS. 6-7.

Figure 6:
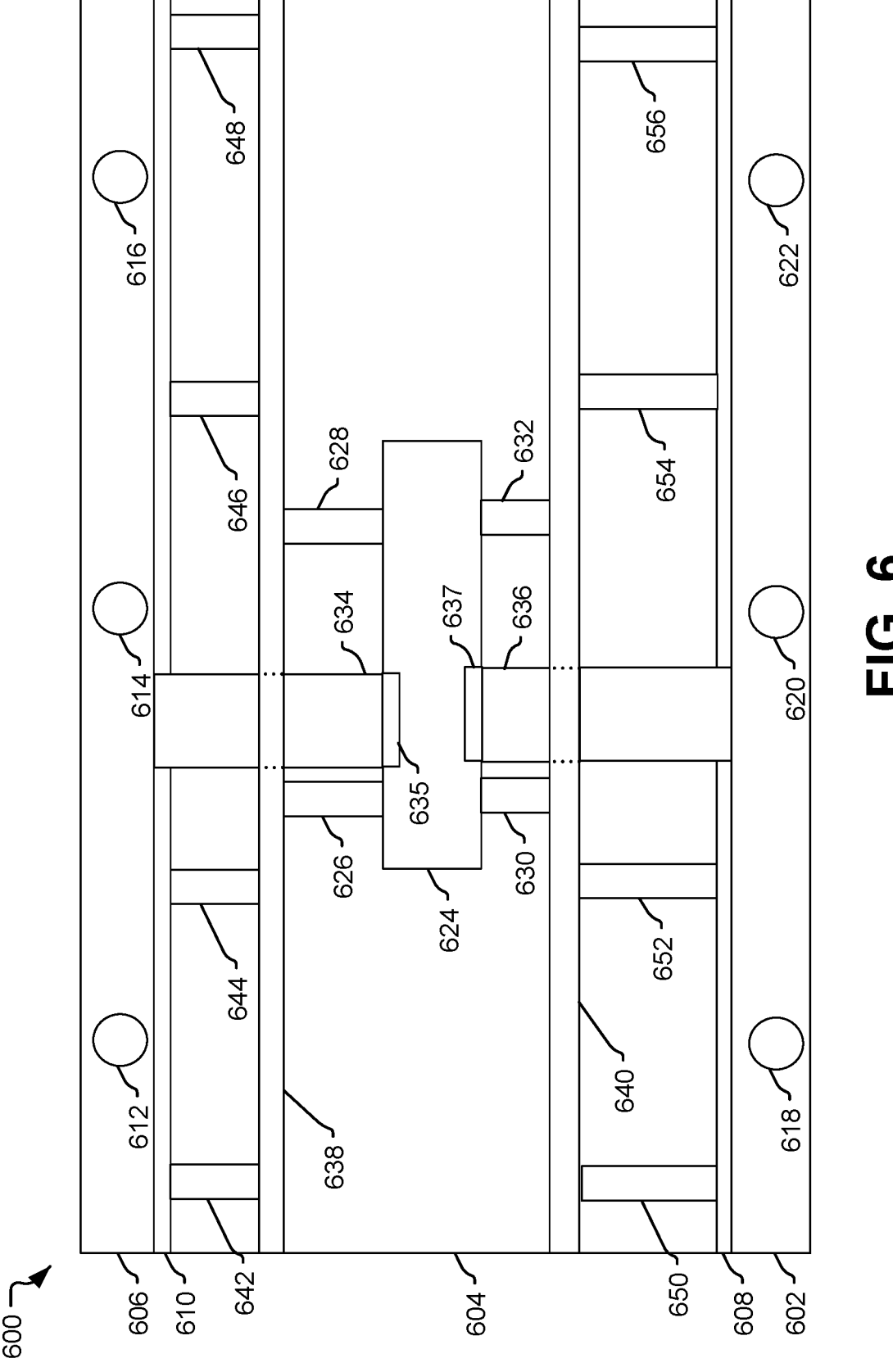
FIG. 6 illustrates a block diagram of an exemplary circuit board, in accordance with certain aspects of the subject disclosure.

FIG. 6 illustrates a block diagram of an exemplary circuit board 600, in accordance with certain aspects of the subject disclosure. In some implementations, the circuit board 600 includes a substrate 604, a power amplifier 624 within the substrate 604, and one or more waveguides 634, 636 within the substrate 604 and electrically coupled to the power amplifier 624. In a particular aspect, the power amplifier 624 is communicatively coupled to the waveguides 634, 636 via a waveguide launcher 635, 637, respectively. In the same or alternative particular aspects, the power amplifier 624 can include a monolithic microwave integrated circuit ("MMIC").

In a particular aspect, the substrate 604 can be coupled to a cold plate 602 via a layer 608 of a high-performance thermal interface material and coupled to a cold plate 606 via a layer 610 of the high-performance thermal interface material. The high-performance thermal interface material is a material with a high thermal conductivity and capable of a thin bond line between the substrate 604 and the cold plates 602, 606. In a particular configuration, the substrate 604 has a thickness less than would be traditionally used. For example, certain existing printed circuit boards can have a thickness in the range of 60-100 mils. The substrate 604, by contrast, can have a thickness of approximately 25 mils. The substrate 604 can be more pliable than traditional printed circuit boards, allowing the layer 610 of the high-performance thermal interface material to be used to aid in heat dissipation from the power amplifier 624 to the cold plates 602, 606, along with the heat dissipation elements 626, 628, 630, 632, 638, 640, 642, 644, 646, 648, 650, 652, 654, 656 described below. For example, a substrate 604 with a thickness of approximately 25 mils, along with the layer 610 of approximately 5 mils, can enable an increase in heat dissipation from approximately 0.8 W/cm² to approximately 4 W/cm².

In some aspects, the power amplifier 624 can include one or more active circuit elements, passive circuit elements, or a combination thereof, configured to substantially amplify a power level of an input electromagnetic signal. The power amplifier 624 can be considered to be within the substrate 604 when one or more of the switching components of the power amplifier 624 is fully contained within the substrate 604.

In some aspects, the circuit board 600 can also include one or more heat sink elements 626, 628, 630, 632, 638, 640, 642, 644, 646, 648, 650, 652, 654, 656 configured to transfer heat from the power amplifier 624 toward a major surface of the substrate 604. In a particular aspect, at least one of the heat sink element(s) is directly coupled to the power amplifier 624. For example, the heat sink elements 626, 628, 630, 632 can be directly coupled to the power amplifier 624 and configured to transfer heat from the power amplifier 624 to heat sink elements 638, 640, which in turn transfer heat to heat sink elements 642, 644, 646, 648 configured to transfer heat to a first major surface of the substrate 604 and the heat sink elements 650, 652, 654, 656 configured to transfer heat to a second major surface of the substrate 604. In a particular configuration in which the power amplifier 624 includes a MMIC, one or more of the heat sink elements (e.g., the heat sink elements 626, 628, 630, 632 can be configured to directly attach to the MMIC die.

In some implementations, the circuit board 600 can include a first cold plate 606 thermally coupled to the first major surface of the substrate 604. The first cold plate 606 can include one or more first cooling elements 612, 614, 616 configured to extract heat from the power amplifier 624. In some aspects, the cooling elements 612, 614, 616 can include fluid-filled channels, as described in more detail above with reference to FIG. 5. In the same or alternative implementations, the circuit board 600 can also include a second cold plate 602 thermally coupled to the second major surface of the substrate 604. The second cold plate 602 can include one or more second cooling elements 618, 620, 622 configured to extract heat from the power amplifier 624. In some aspects, the cooling elements 618, 620, 622 can include fluid-filled channels, as described in more detail above with reference to FIG. 5.

Figure 7:
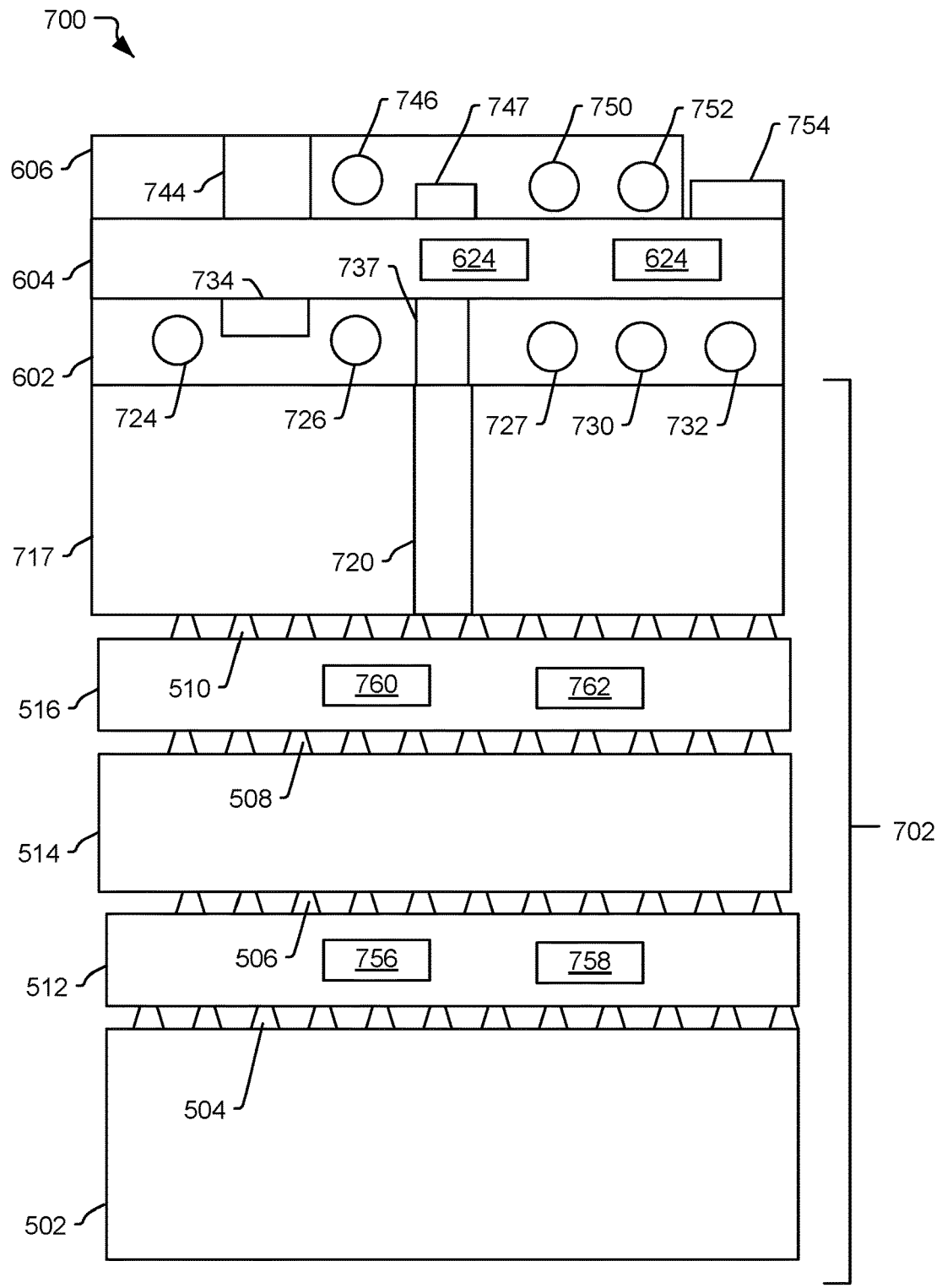
FIG. 7 illustrates a block diagram of an exemplary multi-embedded circuit board including the power amplifier of FIG. 6 thermally coupled to the plurality of cold plates, wherein one of the plurality of cold plates is coupled to an end of the integrated circuit board module, in accordance with certain aspects of the subject disclosure.

FIG. 7 illustrates a block diagram of an exemplary multi-embedded circuit board 700 including the power amplifier 624 of FIG. 6 thermally coupled to the plurality of cold plates 602, 606, wherein one of the plurality of cold plates 602, 606 is coupled to an end of the integrated circuit board module 702, in accordance with certain aspects of the subject disclosure.

In some implementations, the integrated circuit board module 702 includes the digital printed circuit board layer 502 of FIG. 5, the electromagnetic signal conditioning layer 512, the electromagnetic signal routing layer 514, and the electromagnetic signal driver layer 516. In some aspects, the electromagnetic signal conditioning layer 512 and the electromagnetic signal driver layer 516 can each include one or more driver amplifiers 756, 758, 760, 762. Each of the driver amplifiers 756, 758, 760, 762 can be, for example, a monolithic microwave integrated circuit configured to amplify a signal input to the respective layer. Generally, the driver amplifiers 756, 758, 760, 762 will amplify the signal at a lower power level than the power amplifier 624 of FIG. 6.

The integrated circuit board module 702 can also include a waveguide launcher layer 717 substantially similar to the waveguide launcher layer 518 of FIG. 5. In the illustrated example of FIG. 7, the waveguide launcher layer 717 includes a single waveguide 720. As described above with reference to FIGS. 1 and 5, more, fewer, and/or different waveguides could be present within a waveguide launcher layer without departing from the scope of the subject disclosure.

In some implementations, the multi-embedded circuit board 700 can also include the cold plate 602 coupled to an end of the integrated circuit board module 702. For example, the cold plate 602 can be configured to be directly coupled to the end of the integrated circuit board module 702 proximate the waveguide launcher layer 717. In some aspects, the cold plate 602 can include a waveguide 737 substantially the same size as the waveguide 720 of the waveguide launcher layer 717 and positioned as to align with the waveguide 720. The cold plate 602 can also include one or more cavities 734 configured to align with another waveguide in the substrate 604, the cold plate 606, or both, as described in more detail below. The cold plate 602 can also include a plurality of cooling elements 724, 726, 727, 730, 732. Each of the cooling elements 724, 726, 730, 732 are substantially similar to the cooling elements 618, 620, 622 of FIG. 6. The cold plate 602 can also be configured to thermally couple to a first major surface of the substrate 604.

In some implementations, the cold plate 606 can be configured to thermally couple to a second major surface of the substrate 604. The cold plate 606 can include a waveguide 747 substantially the same size as the waveguide 720 of the waveguide launcher layer 717 and positioned as to align with the waveguides 720, 737. The cold plate 602 can also include a waveguide 744 configured to align with another waveguide in the substrate 604, the cold plate 602, or both. For example, the waveguide extending from the cold plate 602 (e.g., from the cavity 734), through the substrate 604 and with the waveguide 744 can be configured to guide the amplified electromagnetic signal from the waveguide launcher layer 717 to an output of the multi-embedded circuit board 700.

In some aspects, the cold plate 606 can also include a plurality of cooling elements 746, 750, 752. The cooling elements 746, 750, 752 are substantially similar to the cooling elements 612, 614, 616 of FIG. 6. In some aspects, the cold plate 606 can also include a power module 754 coupled to the substrate 604. The power module 754 can be configured to provide power to one or more components of the substrate 604. The substrate 604 can also include one or more power amplifiers 624. As described in more detail above with reference to FIG. 6, the power amplifier(s) 624 can be embedded in the substrate 604 and provide signal amplification for the electromagnetic signal.

The illustrations of the examples described herein are intended to provide a general understanding of the structure of the various implementations. The illustrations are not intended to serve as a complete description of all of the elements and features of apparatus and systems that utilize the structures or methods described herein. Many other implementations can be apparent to those of skill in the art upon reviewing the disclosure. Other implementations can be utilized and derived from the disclosure, such that structural and logical substitutions and changes can be made without departing from the scope of the disclosure. For example, the number of printed circuit boards present within each circuit board layer can vary among implementations. Accordingly, the disclosure and the figures are to be regarded as illustrative rather than restrictive.

Moreover, although specific examples have been illustrated and described herein, it should be appreciated that any subsequent arrangement designed to achieve the same or similar results can be substituted for the specific implementations shown. This disclosure is intended to cover any and all subsequent adaptations or variations of various implementations. Combinations of the above implementations, and other implementations not specifically described herein, will be apparent to those of skill in the art upon reviewing the description.

The Abstract of the Disclosure is submitted with the understanding that it will not be used to interpret or limit the scope or meaning of the claims. In addition, in the foregoing Detailed Description, various features can be grouped together or described in a single implementation for the purpose of streamlining the disclosure. Examples described above illustrate but do not limit the disclosure. It should also be understood that numerous modifications and variations are possible in accordance with the principles of the subject disclosure. As the following claims reflect, the claimed subject matter can be directed to less than all of the features of any of the disclosed examples. Accordingly, the scope of the disclosure is defined by the following claims and their equivalents.

Further, the disclosure comprises embodiments according to the following examples:

According to Example 1, a circuit board includes a substrate; a power amplifier within the substrate; and one or more waveguide launchers within the substrate and electrically coupled to the power amplifier.

Example 2 includes the circuit board of Example 1, further including one or more heat sink elements coupled to the power amplifier, at least one of the one or more heat sink elements configured to transfer heat toward a major surface of the substrate.

Example 3 includes the circuit board of Example 2, wherein the at least one of the one or more heat sink elements is directly coupled to the power amplifier.

Example 4 includes the circuit board of any of Examples 1 to 3, wherein the power amplifier comprises a monolithic microwave integrated circuit.

Example 5 includes the circuit board of any of Examples 1 to 4, further comprising one or more electromagnetic signal interfaces coupled to the power amplifier.

Example 6 includes the circuit board of Example 5, wherein at least one of the one or more electromagnetic signal interfaces comprises a coaxial interface.

Example 7 includes the circuit board of any of Example 5 or Example 6, wherein at least one of the one or more electromagnetic signal interfaces comprises a waveguide.

Example 8 includes the circuit board of Example 7, wherein at least one of the one or more waveguide launchers is coupled to the waveguide.

Example 9 includes the circuit board of Example 7 or Example 8, wherein the waveguide is configured to substantially align with a corresponding waveguide of an integrated circuit board module.

Example 10 includes the circuit board of any of Examples 5 to 9 wherein the one or more electromagnetic signal interfaces comprises one or more input electromagnetic signal interfaces and one or more output electromagnetic signal interfaces.

Example 11 includes the circuit board of any of Examples 1 to 10, wherein the circuit board is configured to have a processing function, the processing function comprising adjusting an electromagnetic signal.

Example 12 includes the circuit board of Example 11, wherein adjusting the electromagnetic signal comprises amplifying the electromagnetic signal.

Example 13 includes the circuit board of Example 11 or Example 12, wherein the processing function further includes receiving an electromagnetic signal at a first end of the circuit board; and transmitting the electromagnetic signal at a second end of the circuit board.

Example 14 includes the circuit board of any of Examples 1 to 13, further comprising an antenna element within the substrate, the antenna element coupled to the power amplifier and at least one of the one or more waveguide launchers.

Example 15 includes the circuit board of Example 14, wherein the antenna element comprises an element of a phased array.

According to Example 16, a multi-embedded circuit board includes a first circuit board including a substrate; and a power amplifier within the substrate, the power amplifier electrically coupled to one or more electromagnetic signal interfaces; and a first cold plate thermally coupled to the first circuit board, the first cold plate comprising one or more first cooling elements configured to extract heat from the power amplifier.

Example 17 includes the multi-embedded circuit board of Example 16, further comprising one or more waveguide launchers within the substrate and electrically coupled to the power amplifier.

Example 18 includes the multi-embedded circuit board of Example 16 or Example 17, wherein the first cold plate is thermally coupled to the first circuit board with high performance thermal interface material.

Example 19 includes the multi-embedded circuit board of any of Examples 16 to 18, further comprising a second cold plate thermally coupled to the first circuit board opposite the first cold plate, the second cold plate comprising one or more second cooling elements configured to extract heat from the power amplifier.

Example 20 includes the multi-embedded circuit board of any of Examples 16 to 19, further comprising one or more heat sink elements coupled to the power amplifier, at least one of the one or more heat sink elements configured to transfer heat toward a major surface of the substrate.

Example 21 includes the multi-embedded circuit board of Example 20, wherein the at least one of the one or more heat sink elements is directly coupled to the power amplifier.

Example 22 includes the multi-embedded circuit board of any of Examples 16 to 21, wherein the power amplifier comprises a monolithic microwave integrated circuit.

Example 23 includes the multi-embedded circuit board of any of Examples 16 to 22, wherein the first cold plate comprises a plurality of fluid-filled channels.

Example 24 includes the multi-embedded circuit board of any of Examples 16 to 23, wherein at least one of the one or more electromagnetic signal interfaces comprises a coaxial interface.

Example 25 includes the multi-embedded circuit board of any of Examples 16 to 24, wherein at least one of the one or more electromagnetic signal interfaces comprises a waveguide.

Example 26 includes the multi-embedded circuit board of Example 25, further comprising one or more waveguide launchers within the substrate and electrically coupled to the power amplifier, wherein at least one of the one or more waveguide launchers is coupled to the waveguide.

Example 27 includes the multi-embedded circuit board of Example 26, wherein the waveguide is configured to substantially align with a corresponding waveguide of an integrated circuit board module.

Example 28 includes the multi-embedded circuit board of any of Examples 16 to 27, wherein the one or more electromagnetic signal interfaces comprises one or more input electromagnetic signal interfaces and one or more output electromagnetic signal interfaces.

Example 29 includes the multi-embedded circuit board of any of Examples 16 to 28, wherein the circuit board is configured to have a processing function, the processing function comprising adjusting an electromagnetic signal.

Example 30 includes the multi-embedded circuit board of Example 29, wherein adjusting the electromagnetic signal comprises amplifying the electromagnetic signal.

Example 31 includes the multi-embedded circuit board of Example 29 or Example 30, wherein the processing function further includes receiving an electromagnetic signal at a first end of the circuit board; and transmitting the electromagnetic signal at a second end of the circuit board.

Example 32 includes the multi-embedded circuit board of any of Examples 16 to 31, further comprising an antenna element within the substrate, the antenna element coupled to the power amplifier.

Example 33 includes the multi-embedded circuit board of Example 32, wherein the antenna element comprises an element of a solid state phased array.

According to Example 34, a multi-embedded circuit board includes a plurality of circuit boards stacked one on another, at least one of the circuit boards of the plurality of circuit boards being configured so as to have a different processing function than another processing function of another circuit board of the plurality of circuit boards; an interconnection join layer disposed between adjacent circuit boards of the plurality of circuit boards, wherein the interconnection join layer is physically coupled to the adjacent circuit boards and includes vias that extend through the interconnection join layer to electrically couple the adjacent circuit boards to each other so as to form an integrated circuit board module having a predetermined electromagnetic communication characteristic; a first cold plate coupled to an end of the integrated circuit board module; and a power amplification layer coupled to the first cold plate, the power amplification layer communicatively coupled to the integrated circuit board module by one or more waveguides that extend through the first cold plate.

Example 35 includes the multi-embedded circuit board of Example 34, wherein the first cold plate comprises a plurality of fluid-filled channels.

Example 36 includes the multi-embedded circuit board of Example 34 or Example 35, wherein the power amplification layer includes a substrate; and a power amplifier within the substrate, the power amplifier electrically coupled to one or more electromagnetic signal interfaces.

Example 37 includes the multi-embedded circuit board of any of Examples 34 to 36, wherein the first cold plate is thermally coupled to the power amplification layer with high performance thermal interface material.

Example 38 includes the multi-embedded circuit board of any of Examples 34 to 37, further comprising a second cold plate thermally coupled to the power amplification layer opposite the first cold plate.

Example 39 includes the multi-embedded circuit board of Example 36, further comprising one or more heat sink elements coupled to the power amplifier, at least one of the one or more heat sink elements configured to transfer heat toward a major surface of the substrate.

Example 40 includes the multi-embedded circuit board of Example 39, wherein the at least one of the one or more heat sink elements is directly coupled to the power amplifier.

Example 41 includes the multi-embedded circuit board of any of Examples 36 to 40, wherein the power amplifier comprises a monolithic microwave integrated circuit.

Example 42 includes the multi-embedded circuit board of any of Examples 36 to 41, wherein the power amplification layer further comprises one or more waveguide launchers within the substrate and electrically coupled to the power amplifier.

Example 43 includes the multi-embedded circuit board of any of Examples 36 to 42, wherein at least one of the one or more electromagnetic signal interfaces comprises a coaxial interface.

Example 44 includes the multi-embedded circuit board of any of Examples 36 to 43, wherein at least one of the one or more electromagnetic signal interfaces comprises a waveguide.

Example 45 includes the multi-embedded circuit board of Example 44, wherein the power amplification layer further comprises one or more waveguide launchers within the substrate and electrically coupled to the power amplifier, wherein at least one of the one or more waveguide launchers is coupled to the waveguide.

Example 46 includes the multi-embedded circuit board of Example 45, wherein the waveguide is configured to substantially align with a corresponding waveguide of the integrated circuit board module.

Example 47 includes the multi-embedded circuit board of any of Examples 34 to 46, wherein the one or more electromagnetic signal interfaces comprises one or more input electromagnetic signal interfaces and one or more output electromagnetic signal interfaces.

Example 48 includes the multi-embedded circuit board of any of Examples 34 to 47, wherein the power amplification layer is configured to have a processing function, the processing function comprising adjusting an electromagnetic signal.

Example 49 includes the multi-embedded circuit board of Example 48, wherein adjusting the electromagnetic signal comprises amplifying the electromagnetic signal.

Example 50 includes the multi-embedded circuit board of Example 48 or Example 49, wherein the processing function further includes receiving an electromagnetic signal at a first end of the power amplification layer; and transmitting the electromagnetic signal at a second end of the power amplification layer.

Example 51 includes the multi-embedded circuit board of any of Examples 36 to 50, wherein the power amplification layer further comprises an antenna element within the substrate, the antenna element coupled to the power amplifier.

Example 52 includes the multi-embedded circuit board of Example 51, wherein the antenna element comprises an element of a phased array.

Example 53 includes the multi-embedded circuit board of Example 51 or Example 52, wherein the antenna element comprises a solid state phased array, the solid state phased array comprising a plurality of elements; and the power amplification layer comprises a plurality of power amplifiers within the substrate, each of the plurality of power amplifiers electrically coupled to one or more electromagnetic signal interfaces and each of the plurality of power amplifiers is associated with a respective one of the plurality of elements of the solid state phased array.

What is claimed is:

1. A circuit board comprising:
a substrate;
a power amplifier within the substrate;
one or more waveguide launchers within the substrate and electrically coupled to the power amplifier; and
an antenna element within the substrate, the antenna element coupled to the power amplifier and at least one of the one or more waveguide launchers.

2. The circuit board of claim 1, further comprising one or more heat sink elements coupled to the power amplifier, at least one of the one or more heat sink elements configured to transfer heat toward a major surface of the substrate.

3. The circuit board of claim 2, wherein the at least one of the one or more heat sink elements is directly coupled to the power amplifier.

4. The circuit board of claim 1, wherein the power amplifier comprises a monolithic microwave integrated circuit.

5. The circuit board of claim 1, further comprising one or more electromagnetic signal interfaces coupled to the power amplifier.

6. The circuit board of claim 1, wherein the antenna element comprises an element of a phased array.

7. The circuit board of claim 1, wherein the antenna element comprises an element of a phased array.

8. A multi-embedded circuit board comprising:
a first circuit board comprising:
a substrate;
a power amplifier within the substrate, the power amplifier electrically coupled to one or more electromagnetic signal interfaces; and
one or more waveguide launchers within the substrate and electrically coupled to the power amplifier; and
a first cold plate thermally coupled to the first circuit board, the first cold plate comprising one or more first cooling elements configured to extract heat from the power amplifier.

9. The multi-embedded circuit board of claim 8, wherein the first cold plate comprises a plurality of fluid-filled channels and the second cold plate comprises a plurality of fluid-filled channels.

10. The multi-embedded circuit board of claim 8, further comprising one or more heat sink elements coupled to the power amplifier, at least one of the one or more heat sink elements configured to transfer heat toward a major surface of the substrate.

11. The multi-embedded circuit board of claim 10, wherein the at least one of the one or more heat sink elements is directly coupled to the power amplifier.

12. The multi-embedded circuit board of claim 8, wherein the first cold plate comprises a plurality of fluid-filled channels.

13. The multi-embedded circuit board of claim 8, wherein at least one of the one or more electromagnetic signal interfaces comprises a waveguide.

14. The multi-embedded circuit board of claim 13, further comprising one or more waveguide launchers within the substrate and electrically coupled to the power amplifier, wherein at least one of the one or more waveguide launchers is coupled to the waveguide.

15. The multi-embedded circuit board of claim 14, wherein the waveguide is configured to substantially align with a corresponding waveguide of an integrated circuit board module.

16. The multi-embedded circuit board of claim 8, wherein the power amplifier comprises a monolithic microwave integrated circuit.

17. A multi-embedded circuit board comprising:
a plurality of circuit boards stacked one on another, at least one of the circuit boards of the plurality of circuit boards being configured so as to have a different processing function than another processing function of another circuit board of the plurality of circuit boards;
an interconnection join layer disposed between adjacent circuit boards of the plurality of circuit boards, wherein the interconnection join layer is physically coupled to the adjacent circuit boards and includes vias that extend through the interconnection join layer to electrically couple the adjacent circuit boards to each other so as to form an integrated circuit board module having a predetermined electromagnetic communication characteristic;
a first cold plate coupled to an end of the integrated circuit board module; and
a power amplification layer coupled to the first cold plate, the power amplification layer communicatively coupled to the integrated circuit board module by one or more waveguides that extend through the first cold plate.

18. The multi-embedded circuit board of claim 17, wherein the power amplification layer comprises:
a substrate; and
a power amplifier within the substrate, the power amplifier electrically coupled to one or more electromagnetic signal interfaces.

19. The multi-embedded circuit board of claim 18, wherein the power amplification layer further comprises one or more waveguide launchers within the substrate and electrically coupled to the power amplifier.

20. The multi-embedded circuit board of claim 18, wherein:
the power amplification layer further comprises an antenna element within the substrate, the antenna element coupled to the power amplifier;
the antenna element comprises a phased array, the phased array comprising a plurality of elements; and
the power amplification layer comprises a plurality of power amplifiers within the substrate, each of the plurality of power amplifiers electrically coupled to one or more electromagnetic signal interfaces and each of the plurality of power amplifiers is associated with a respective one of the plurality of elements of the phased array.

* * * * *